(12) United States Patent
Nam et al.

(10) Patent No.: US 6,211,519 B1
(45) Date of Patent: Apr. 3, 2001

(54) TRANSITION-EDGE SENSOR WITH ENHANCED ELECTROTHERMAL FEEDBACK FOR CRYOGENIC PARTICLE DETECTION

(75) Inventors: Sae Woo Nam, Palo Alto; Blas Cabrera, Stanford, both of CA (US)

(73) Assignee: The Board of Trustees of the LeLand Stanford Junior University, Stanford, CA (US)

( * ) Notice: Subject to any disclaimer, the term of this patent is extended or adjusted under 35 U.S.C. 154(b) by 0 days.

(21) Appl. No.: 09/152,747

(22) Filed: Sep. 14, 1998

(51) Int. Cl.$^7$ .................................................. H01L 39/06
(52) U.S. Cl. .................................................... 250/336.2
(58) Field of Search .............................. 250/336.1, 336.2; 374/176; 324/248, 244, 260, 262; 327/527; 505/845, 846

(56) References Cited

U.S. PATENT DOCUMENTS

| | | | |
|---|---|---|---|
| 4,853,538 | * | 8/1989 | Jackson ............................. 250/336.2 |
| 5,028,786 | * | 7/1991 | Da Silva et al. ................. 250/336.2 |
| 5,635,834 | * | 6/1997 | Sloggett et al. ..................... 324/248 |
| 5,640,010 | * | 6/1997 | Twerenbold ......................... 250/281 |
| 5,641,961 | * | 6/1997 | Irwin et al. ....................... 250/336.2 |
| 5,994,694 | * | 11/1999 | Frank et al. ......................... 250/281 |

OTHER PUBLICATIONS

"Operation of an Improved 100g Si FLIP Detector for the CDMS Experiment," Clarke et al. http://HEP.Stanford.EDV/~cabrera/indexcdms.html, Dec. 1997.*

"Tc Tuning of Tungsten Transition Edge Sensors Using Iron Implantation," Young et al. Proceedings of the VIII International Workshop on Low Temperature Detectors, Aug. 1999.*

* cited by examiner

Primary Examiner—Constantine Hannaher
(74) Attorney, Agent, or Firm—Lumen Intellectual Property Services

(57) ABSTRACT

A superconducting transition-edge sensor with an electrothermal-feedback circuit, a heat sink thermally coupled thereto, a bias-feedback circuit electrically coupled with the electrothermal feedback circuit, and a current sensor electrically coupled with the bias-feedback circuit and inductively coupled with the electrothermal-feedback circuit.

21 Claims, 6 Drawing Sheets

TRANSITION-EDGE SENSOR WITH ENHANCED ELECTROTHERMAL FEEDBACK FOR CRYOGENIC PARTICLE DETECTION

STATEMENT REGARDING FEDERALLY-SPONSORED RESEARCH OR DEVELOPMENT

This invention was made with government support under contract DE-FG03-90ER4056 awarded by DOE. The US government has certain rights in this invention.

CROSS-REFERENCE TO RELATED APPLICATIONS

Not Applicable

REFERENCE TO MICROFICHE APPENDIX

Not Applicable

BACKGROUND OF THE INVENTION

This invention relates to detectors for measuring the energy of elementary particles, specifically to a superconducting transition-edge sensor with enhanced electrothermal feedback.

One example of an elementary particle is the Photon, which is the individual quantum of electromagnetic radiation. Known forms of electromagnetic radiation, arranged in the order of increasing energy and decreasing wavelength, include radio waves, microwaves, infrared (IR) radiation, visible light, ultraviolet (UV) radiation, X-rays, and gamma rays. High-resolution elementary-particle detectors have many applications, such as infrared bolometry, X-ray spectroscopy in the area of material science, X-ray astronomy, and optical-photon detection. Important goals in the design of such detectors include higher maximum count rates as well as an improvement in resolution by linearizing the detector through negative electrothermal feedback.

Some varieties of elementary-particle detectors are based on the principle of superconductivity, which is a low-temperature phenomenon where the resistance of certain materials drops essentially to zero at a critical transition temperature typically near absolute zero. One type of known superconducting sensor capable of detecting elementary particles, including individual photons from the infrared (IR) through the gamma regions of the electromagnetic spectrum, is the transition-edge sensor (TES). The transition-edge sensor operates most efficiently when its detector element serves as an active component in an electrothermal-feedback (ETF) loop. The detector element of a TES comprises a thin film made of a superconducting material and is designed to operate within a temperature range $\Delta T$ (FIG. 1), which defines the superconducting transition in electrical conductance for that material. Critical temperature $T_c$ marks the middle of the temperature range $\Delta T$. In the superconducting-transition temperature range $\Delta T$, the detector element has the properties of a temperature-sensitive resistor with a high positive temperature coefficient of electrical resistance. The temperature coefficient of electrical resistance represents the amount of change that occurs in the resistance R of the detector element as a result of a change in temperature T. A related quantity, $\alpha_o$, defined as either $(T/R)(dR/dT)$ or $d \ln R/d \ln T$, is a unitless measure of the sharpness of the superconducting transition of the detector element.

Generally, a heat sink is placed in thermal contact with the detector element for dissipating the energy of the detector. The temperature of the detector element is maintained within its superconducting-transition region by applying an appropriate voltage bias across the detector element. The temperature of the heat sink is held well below $T_c$. The voltage bias produces a current through the detector, resulting in a heating effect, known as the Joule effect or Joule heating. Thermal equilibrium of the detector element is achieved by matching the Joule heating of the detector element with the heat dissipated from the detector to the heat sink, which, to first order, remains constant. As apparent from FIG. 1, due to a high positive temperature coefficient of electrical resistance the detector element possesses in its superconducting-transition region, a small change in the temperature of the detector element responsive to energy deposited into the detector element, e.g., by radiation directly incident upon the detector, is accompanied by a large change in electrical resistance. The increase in the resistance of the detector results in a decrease of the current flow therethrough and hence a decrease in Joule heating. The temperature of the detector element therefore decreases and its thermal equilibrium is re-established with the help of a negative electrothermal-feedback loop where the current through the detector element and the corresponding Joule heating thereof are inversely proportional to the detector's electrical resistance (Joule heating=$V^2/R$ where V is the voltage bias across the detector and R is the resistance of the detector element). Alternatively stated, the voltage bias across the detector element creates a current therethrough that is sufficient to raise the temperature of the detector element by Joule heating to a level within the superconducting transition where a further increase in the temperature of the detector element, corresponding to energy deposited into the detector element by, e.g., an incident radiation particle, reduces the Joule heating by increasing the electrical resistance of the detector element and hence reduces the current through the detector element, thus stabilizing the temperature thereof. Thus, it is primarily the reduction in Joule heating which compensates for the energy increase of the detector element due to a particle incident thereon. The observed result is a current pulse with a pulse-decay time considerably shorter than the intrinsic pulse-decay time determined by the heat capacity of the detector element and the thermal conductivity of the heat sink. Since the energy of a particle incident on the detector element can be calculated by integrating the changes in the current though the detector element occurring over time, variations in the current through the detector element are measured to provide a signal indicative of the energy of the particle.

The higher the positive temperature coefficient of the material comprising the detector element of the TES, the faster the temperature of that detector element will stabilize following an energy pulse deposited into the detector element by a particle incident thereon, thus allowing a TES to have shorter pulse-recovery times and higher count rates. However, the temperature coefficient of electrical resistance is also the limiting factor with respect to the pulse-recovery time of the sensor because this temperature coefficient is a fixed quantity that is a function of the detector material. Thus, the count rates of which the sensor is capable approach a theoretical limit determined by the temperature coefficient of the detector material in its superconducting-transition region.

BRIEF SUMMARY OF THE INVENTION

It is accordingly desirable to provide a superconducting transition-edge sensor having short pulse-recovery times and high maximum count rates.

Furthermore, it is desirable to provide a superconducting transition-edge sensor whose detector element may be manufactured from a wide range of superconducting materials.

Moreover, it is desirable to provide a superconducting transition-edge sensor which can be tuned so that properties such as the heat capacity of the detector and $\alpha_o$ at the operating point of the detector can be determined.

Other advantages of the invention will become apparent after consideration of the ensuing description and the accompanying drawings.

In one embodiment of the invention, the superconducting transition-edge sensor comprises an electrothermal-feedback circuit, a heat sink thermally coupled thereto, a bias-feedback circuit electrically coupled with the electrothermal feedback circuit, and a current sensor electrically coupled with the bias-feedback circuit and inductively coupled with the electrothermal-feedback circuit.

BRIEF DESCRIPTION OF THE SEVERAL VIEWS OF THE DRAWING

The present invention is illustrated by way of example, and not by way of limitation, in the figures of the accompanying drawings, where.

DETAILED DESCRIPTION OF THE INVENTION

Figure 1:
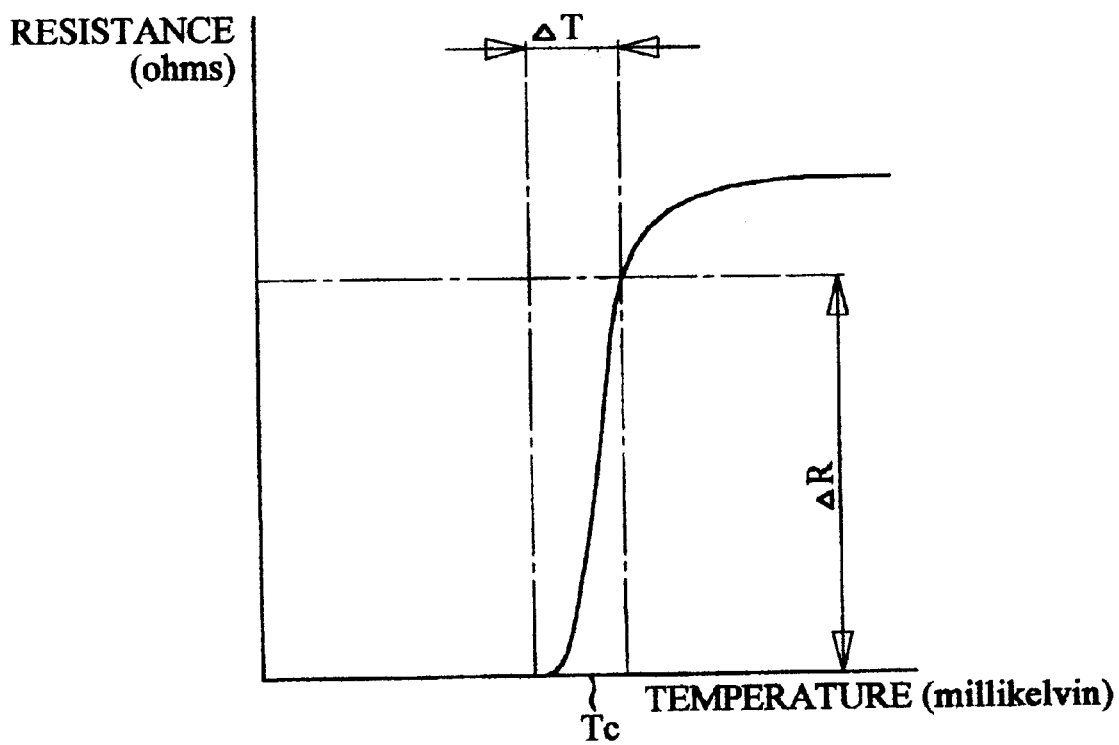
FIG. 1 is a graph representing the resistive properties of a superconducting material in its superconducting-transition region.

Throughout the following description, specific details are set forth in order to provide a more thorough understanding of the invention. However, the invention may be practiced without these particulars. In other instances, well-known elements have not been shown or described to avoid unnecessarily obscuring the invention. Accordingly, the specification and drawings are to be regarded in an illustrative, rather than a restrictive, sense.

A significant improvement in the performance characteristics of a superconducting transition-edge sensor (TES) with electrothermal feedback (ETF) can be achieved when ETF is further enhanced by modulating (reducing) the voltage bias across the detector element of the sensor during an energy pulse produced by a particle incident on the detector element. By reducing the voltage bias across the detector element during the energy pulse in proportion to the decrease in the current therethrough, the Joule heating is reduced more quickly because the reduced voltage across the detector element results in a current that is smaller than the current that would flow through the detector element of a TES with standard ETF (i.e., a TES with a constant voltage bias). As a result, when a particle incident on the detector element of the improved sensor causes an energy pulse therein, the recovery time of the sensor is shorter than that of a TES with standard ETF and the sensor of the present invention returns to the equilibrium state faster. Consequently, a TES with enhanced ETF enjoys higher maximum count rates than do prior-art sensors.

The temperature T of the detector element, which comprises, e.g., a tungsten film thermally coupled to a heat sink that is maintained at a constant temperature $T_s$, can be adequately described by $$C\frac{dT}{dt} = IV - K(T^n - T_s^n) \quad [1]$$

and $$V=V_b-R_c\Delta I=R_oI_o-R_c\Delta I \quad [2]$$

where C is the heat capacity of the detector element, V is the voltage across the detector element at any given time, I is the current flowing through the detector element in response to the voltage V across the detector, $R_c$ is the coupling factor which determines the amount of bias feedback, $V_b$ is the quiescent voltage across the detector element absent an energy pulse, $\Delta I$ is the absolute value of the change in current through the detector element occurring during an energy pulse produced by a particle incident on the detector element, $R_o$ is the resistance of the detector element at the point of thermal equilibrium where the power gained by the detector element through Joule heating equals the power lost by the detector element to the heat sink, and $I_o$ is the quiescent current through the detector element absent an energy pulse. It should be noted that $R_c$ for TES with standard ETF is zero. The term IV in equation [1] represents the Joule heating of the detector element. In the same equation, the term $K(T^n-T_s^n)$ describes the heat loss to the heat sink, where K is a factor dependent on the material and geometry of the detector element and n is a number whose value depends on thermal impedance between the detector element and the heat sink. The exponent n can take values between 1 and 6, depending on the design of the TES. When the detector element is at thermal equilibrium with $V=V_b$, the Joule heating of the detector element equals the heat loss from the detector element to the heat sink, so that C(dT/dt)=0.

When energy deposited into the detector element by a particle incident thereon increases the temperature T of the detector element a small increment $\delta T$ above the equilibrium temperature $T_o$, the return of the detector element to equilibrium is adequately described, to fist order (i.e., the small-signal limit) by $$C\frac{d\delta T}{dt} = -\frac{R_o + R_c}{R_o - R_c}\frac{P_o\alpha_o}{T_o}\delta T - g_o\delta T \quad [3]$$

where $R_o$ is the resistance of the detector element at the point of thermal equilibrium where the power gained by the detector element through Joule heating equals the power lost by the detector element to the heat sink, $P_o$ is the quiescent power dissipated by the sensor (i.e., Joule power dissipated when the sensor is at thermal equilibrium with no particles incident on the detector element), $\alpha_o=(T/R)(dR/dT)$ is a unitless measure of the sharpness of the superconducting transition of the film comprising the detector element ($\alpha_o$ is related to the temperature coefficient of electrical resistance of the film at its transition in electrical conductance), $g_o \approx nKT^{n-1}$ is the thermal conductance between the detector element and the heat sink, and $T_c$ is the critical temperature of the superconducting material comprising the detector element. Even though $\alpha_o$ is also a function of the current through the detector element, to first order it is accurate to assume that it is independent of the current. The first term on the right-hand side of equation [3] represents the effect that the reduction in Joule heating, caused by negative electro-thermal feedback and enhanced by negative voltage-bias feedback, has on the temperature T of the detector element. The other term on the right-hand side of equation [3] represents the increased heat flow to the heat sink.

When the temperature of the heat sink is much less than the temperature of the detector element, $P_o \approx g_o T/n$ and the time constant for the recovery of the sensor from the energy pulse caused by a particle incident on the detector element for TES with enhanced ETF is given by $$\tau_{enh} = \frac{\tau_o}{1 + \frac{R_o + R_c}{R_o - R_c} \frac{\alpha_o}{n}} \quad [4]$$

where $\tau_o = C/g_o$ is the intrinsic time constant for the recovery of the sensor (i.e., pulse-recovery time constant of the sensor in the absence of Joule heating).

If $\tau_{enh} \ll \tau_o$, the energy deposited in the detector element by an incident particle is removed primarily by a reduction in Joule heating rather than by increased heat loss to the heat sink. Then, the energy of the incident particle is approximately equal to the time integral of the change in Joule power:

$$E = -\int \Delta P_{Joule} dt \quad [5]$$

Nonuniformities in the properties of the film comprising the detector element and nonlinearities in the resistive transition will make $\alpha_o$ a function of current as well as temperature and will affect the pulse shape, but not the pulse integral.

The pulse-recovery time constant for prior-art TES with standard ETF is simply $$\tau_{etf} = \frac{\tau_o}{1 + \alpha_o/n} \quad [6]$$

As apparent from equation [6], the pulse-recovery time of prior-art TES with standard ETF is faster than the intrinsic recovery time of a TES by a factor of $1 + \alpha_o/n$. In comparison to prior-art TES with standard ETF, the pulse-recovery time for a TES with ETF enhanced by negative bias-voltage feedback according to the present invention is further decreased by a factor of $(R_o + R_c)/(R_o - R_c)$ as $R_c$ approaches $R_o$. In addition to the shorter decay time, the amplitude of the current pulse also increases by a factor of $R_o/(R_o - R_c)$, to first order.

Equation [6] also reveals that the superconducting-transition sharpness $\alpha_o$ is a limiting parameter for prior-art TES with standard ETF. In order to shorten $\tau_{etf}$, it is necessary to increase $\alpha_o$. In other words, the detector element must be made of a material having a high positive coefficient of electrical resistance (high superconductive-transition sharpness) to produce a sensor having short pulse-recovery times and high count rates. However, as apparent from equation [4], high superconductive-transition sharpness loses its critical significance with respect to the count rates of a TES with enhanced ETF. As bias-feedback coupling factor $R_c$ is tuned towards $R_o$, the pulse-recovery time enh decreases for any value of $\alpha_o$.

Figure 2:
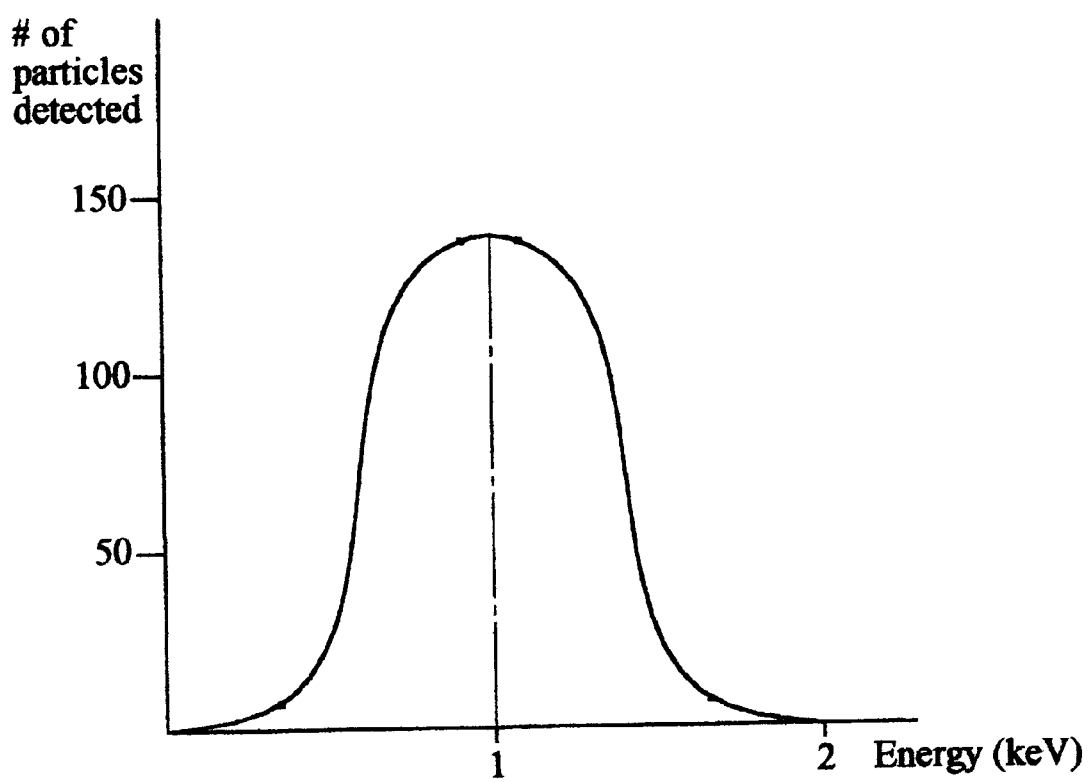
FIG. 2 is a histogram representing the energy resolution of a TES.

The energy resolution, i.e., measurement certainty, of a TES with enhanced electrothermal feedback is primarily limited by Phonon noise (thermodynamic energy variations in the detector element caused by fluctuations in heat flow between the detector element and the heat sink), Johnson noise (electrical noise produced by thermal agitation of electrons in the detector element whereby the instantaneous values of voltage across the detector element fluctuate with respect to the constant average value), and noise associated with the electronic devices, e.g., a direct-current superconductive quantum interference device (DC SQUID), utilized in the sensor circuit. All these sources of noise produce additional measurement uncertainty. For example, when a TES is used to detect particles each having energy of, e.g., 1 KeV, the resulting distribution, shown in FIG. 2, has the shape of a bell curve. Two interrelated ways to define the energy resolution of the sensor are $\Delta E_{Root-Mean-Square}$ and $\Delta E_{Full\ Width\ at\ Half\ Maximum}$. $\Delta E_{RMS}$ is obtained by estimating the width of the bell curve along the x-axis at a point along the y-axis determined by taking the square root of the average of the squares of y-values along the curve. $\Delta E_{FWHM}$ is determined by estimating the width of the bell curve shown in FIG. 2 at a point along the y-axis corresponding to a value that is one half of the maximum y-value (maximum number of counts). The fundamental resolution limit may be described, to first order, as $$\Delta E_{FWHM} = 2.355 \Delta E_{RMS} = 2.355 \sqrt{4KT_o^2 \frac{C}{\alpha_o} \sqrt{(\beta^2 + 1)\left(\beta^2 + \frac{n}{2}\right)}} \quad [7]$$

where $\beta$ is the ratio of the electronics noise to Johnson noise. The TES according to the present invention can have an improvement on energy resolution compared to prior-art sensors because the enhanced electrothermal feedback it provides can reduce the negative effects of the superconductive-transition nonlinearities on resolution. In other words, because the TES with enhanced ETF benefits from negative voltage feedback, it can respond to energy inputs faster than prior art sensors. As apparent from equation [7], the resolution of the TES can additionally be improved by utilizing a detector element made from a material having a low equilibrium temperature $T_o$.

Figure 3:
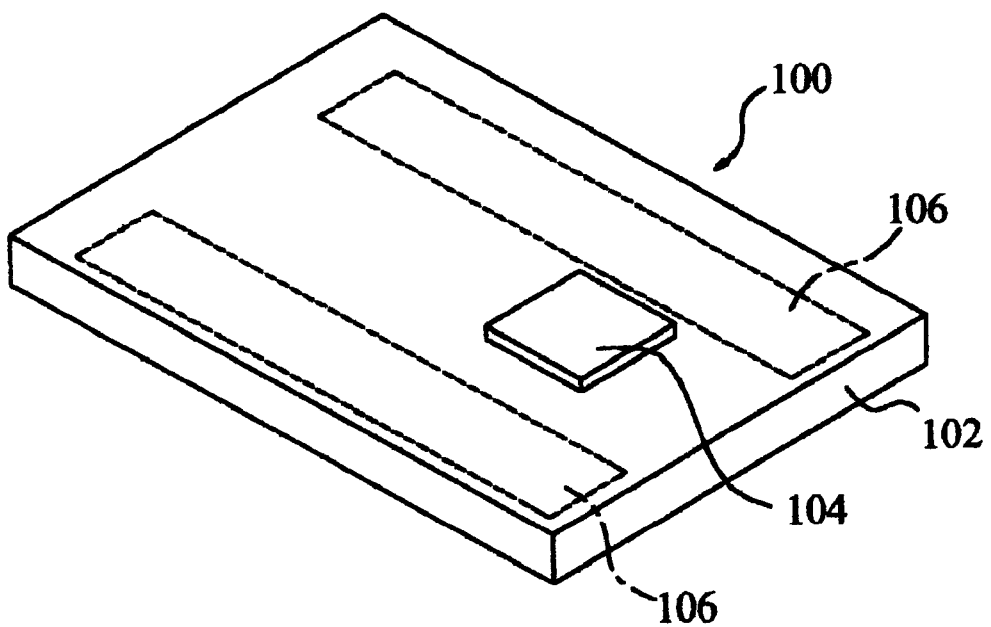
FIG. 3 is a perspective view of a TES in accordance with one embodiment of the present invention.

The TES with enhanced ETF can be constructed in a number of ways. FIG. 3 illustrates one embodiment of the present invention, where a TES 100 comprises a substrate 102 acting as a primary heat sink, a detector element 104, which plays an integral part in the electrothermal-feedback loop, and thermal contacts 106 which provide a thermally-conductive path between substrate 102 and a secondary heat sink (not shown). The secondary heat sink can be, for example, a metal plate of a dilution refrigerator. Other components of the TES have not been shown for simplicity and will be discussed in detail below. Detector element 104 and thermal contacts 106 may comprise thin electrically-conductive films deposited on substrate 102. Detector element 104 is preferably made of a material having a sharp superconducting transition, i.e., a high $\alpha_o$. Such a material can be, for example, tungsten, or a bilayer consisting of a superconducting and a normal film, such as an Al—Ag, Ir—Au, Al—Cu, or Al—Au bilayer. Thermal contacts 106 are made of a good thermal conductor, such as gold. Depending on the design requirements of the TES, thermal contacts 106 and the secondary heat sink may be omitted.

Figure 4:
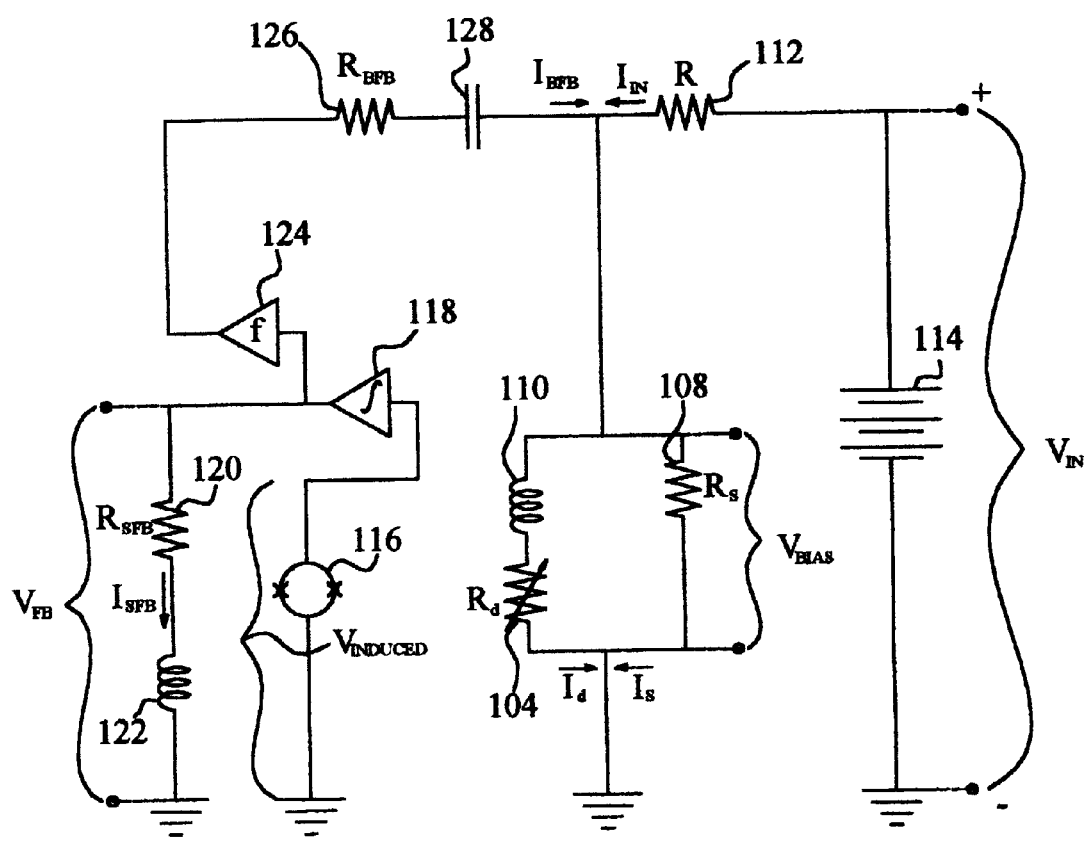
FIG. 4 is a circuit diagram of the TES of FIG. 3.

A circuit diagram of the TES with enhanced electrothermal feedback is shown in FIG. 4. The detector element is schematically represented as a temperature-sensitive resistor 104 having a variable resistance $R_d$ related to the temperature of the detector element. A shunt resistor 108 having a resistance $R_s$ is arranged in parallel with variable resistor 104. An input coil 110 is coupled in series with resistor 104.

A resistor 112 converts DC voltage, $V_{in}$, supplied by a voltage source 114 into a constant current $I_{in}$, which is distributed between the parallel legs of the electrothermal-feedback circuit containing variable resistor 104 and shunt resistor 108. Source 114 and resistor 112 may be replaced with any other arrangement capable of providing a DC current. The resistance $R_s$ of the shunt resistor 108 is chosen to be much smaller than the expected values of resistance of variable resistor 104, which allows resistor 104 to be voltage-biased. The voltage bias is selected so that the temperature of variable resistor 104 comprising the detector element of the TES is within the superconducting-transition region of the material making up the detector element. For example, resistance $R_s$ of shunt 108 may be approximately 20 milliohms, while the resistance of variable resistor 104 may be in the range of 20 milliohms to 10 ohms. The voltage supplied by voltage source 114 may be approximately one volt and resistor 112 may have a value of approximately seven kilohms. The electrothermal-feedback circuit containing variable resistor 104 may be implemented in other ways, so long as resistor 104 remains voltage-biased.

Current-sensing means, including a series array of direct-current superconductive quantum interference devices (DC SQUIDs) 116, is inductively coupled with the electrothermal-feedback circuit described above via input coil 110. SQUID array 116 is schematically represented in FIG. 4 as a single SQUID for simplicity. SQUID 116 is capable of sensing changes in current flowing through variable resistor 104. Alternatively, a single SQUID or any other device capable of accurately measuring changes in current may be employed as the current-sensing means. As the current through variable resistor 104 changes in response to an energy pulse deposited into resistor 104 by an incident particle, a variable voltage signal induced in DC SQUID 116 by coil 110 is amplified by an integrator 118. The amplified signal, $V_{fb}$, is converted into current $I_{sfb}$ by a resistor 120, having a resistance $R_{sfb}$, and is then inductively coupled back into SQUID 116 via coil 122 in order to cancel the magnetic field induced in the SQUID via coil 110. Thus, SQUID 116 placed in a flux-locked feedback loop, whose function is to linearize the SQUID signal. Since $I_{sfb}$ flowing through coil 122 is a factor greater than the corresponding current $I_d$ flowing through coil 110, the flux coupling of coil 110 must exceed that of coil 122 in proportion to the ratio of the currents. For example, the flux-locked feedback loop may be constructed so that coil 110 contains sixteen turns compared to only two for coil 122, which yields a flux-coupling factor, K, of eight. Thus, the voltage output of integrator 118 can be adequately described as $$V_{fb} = I_d \times R_{sfb} \times K \quad [8]$$

where $I_d$ is the current flowing through coil 110.

The variable voltage output of integrator 118 is also electrically coupled to amplifier 124, which has a variable gain f. The design of amplifier 124 is such that it is possible to invert the polarity of the gain when desired so that f can be negative. The output voltage signal of amplifier 124 is coupled to the electrothermal-feedback circuit containing variable resistor 104 through a resistor 126 having a value of $R_{bfb}$, which converts the variable voltage-feedback signal to a variable feedback current. As this current passes through capacitor 128, the undesirable DC offset, produced by amplifiers 118 and 124, is removed. The resulting current $I_{bfb}$ acts to alter the previously-existing voltage bias of variable resistor 104. Thus, the bias-feedback circuit according to one embodiment of the invention includes amplifier 124, resistor 126, and capacitor 128. If desired, the physical orientation of capacitor 128 and resistor 126 may be reversed. In one specific implementation of the invention $R_{bfb}$ is approximately 200 ohms, $R_{sfb}$ is approximately one kiloohm, and the capacitance of capacitor 128 is about one microfarad. The part of the TES circuit including the flux-locked DC SQUID 116 and amplifiers 118 and 124 may comprise a DC SQUID array amplifier system commercially available from Hypres, Inc., Elmford, N.Y.

The coupling factor, $R_c$, can be adequately described by $$R_c \approx \frac{f \times R_{sfb} \times K}{R_{bfb}} R_s \quad [9]$$

By adjusting gain f, $R_{sfb}$, and $R_{bfb}$ appropriately, $R_c$ can be tuned to approach $R_o$ so that the time constant for the recovery of the TES from the energy pulse caused by a particle incident on the detector element is given by $\tau_{enh}$. The practical limit of adjusting f to one is discussed below.

Figure 5:
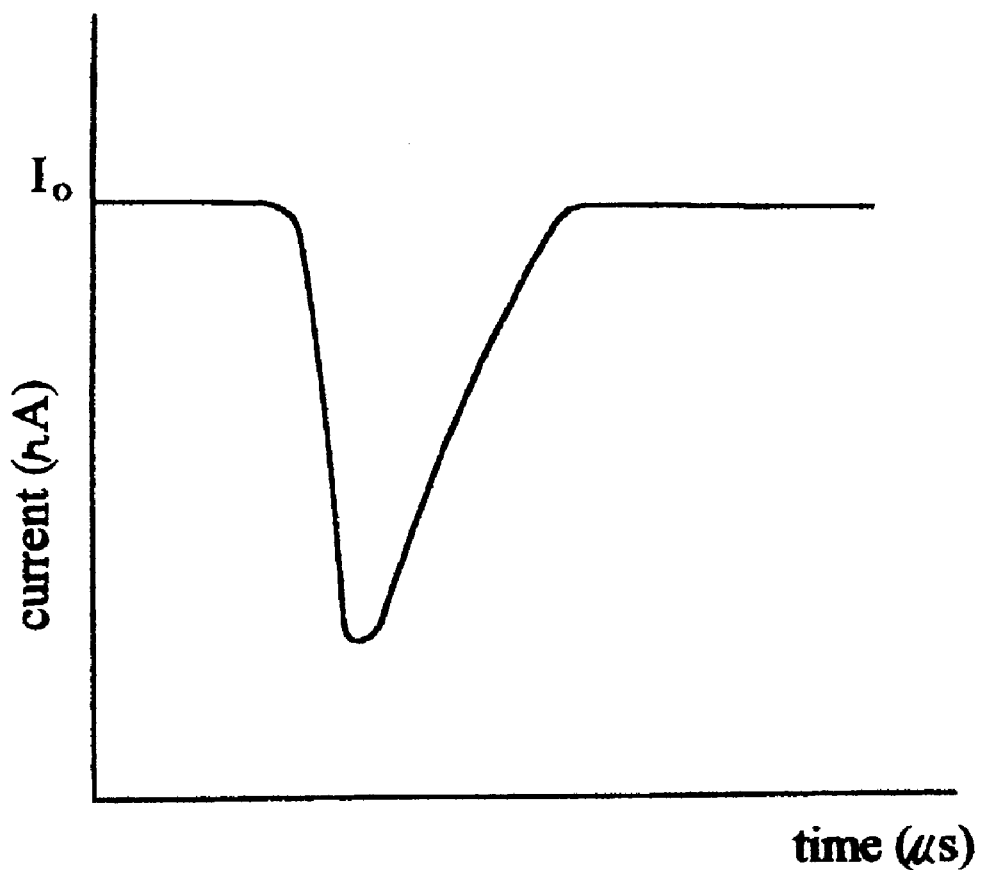
FIG. 5 is a plot of a current pulse through the detector element of the TES of FIG. 4.

A plot of a current pulse through the detector element corresponding to a quantum of energy deposited in the detector element by a particle is shown in FIG. 5. The parameters limiting $\tau_{enh}$ for such a pulse are determined, among other factors, by the thermalization time of the energy within the detector element (i.e., the amount of time it takes the detector element to change its temperature in response to a quantum of energy deposited into it by an incident particle), the electrical time constant given by the SQUID input inductance (L) of coil 110 divided by the resistance of the detector element ($R_d$), and the intrinsic rate of energy dissipation from the detector element to the heat sink. Accordingly, $\tau_{enh}$ can be minimized by choosing a detector element having a smallest possible heat capacity C to decrease thermalization time, selecting a SQUID-input coil with the least possible inductance, and choosing the heat-sink material such that the intrinsic heat dissipation is maximized. Another limitation on possible reduction of $\tau_{enh}$ is how closely the coupling factor $R_c$ can be tuned to approach $R_o$. The obvious limit is $R_c = R_o$, at which point the current through the detector element can no longer be measured and negative voltage feedback becomes impossible. However, the practical limit becomes evident even as $R_c$ is being tuned toward $R_o$. If $R_c$ is made to approach $R_o$ too closely, an undesirable oscillation of the current pulse is observed. The values of $R_c$ that make the system oscillate can be determined experimentally and limit how much it is possible to reduce $\tau_{enh}$. Yet another limitation on $\tau_{enh}$ is the speed of the electronic components of the sensor, which determines how quickly the voltage feedback is implemented.

In addition to using voltage-bias feedback to decrease the sensor recovery time, it can be utilized to determine certain properties of the TES. If voltage-bias feedback is switched from negative to positive by inverting the polarity of gain f and adjusting f appropriately, then $R_c = -R_o$, and that the net Joule power feedback is zero. As a result, the pulse decays with the intrinsic time constant $\tau_o$. Using the quiescent operating point (where no incident particles strike the detector element and the Joule heating is in equilibrium with the amount of heat lost to the heat sink) as a direct measure of $g_o$, the thermal conductance between the detector element and the heat sink, it is possible to determine the heat capacity C of the TES at its operating point from the observed time constant, $\tau_o$, since $C = \tau_o \times g_o$. Furthermore, once $\tau_o$ is known, $\alpha_o$, at the operating point within the superconducting-transition region of the detector element can be easily calculated from equation [6] after the value of $\tau_{eff}$ is determined by setting the value of gain f to zero. Thus, the voltage-bias feedback provides not only a mechanism for increasing the effective count rate of TES, but also a method for determining sensor properties such as the heat capacity and $\alpha_o$ at the operating point within the superconducting-transition region of the detector element.

Figure 6:
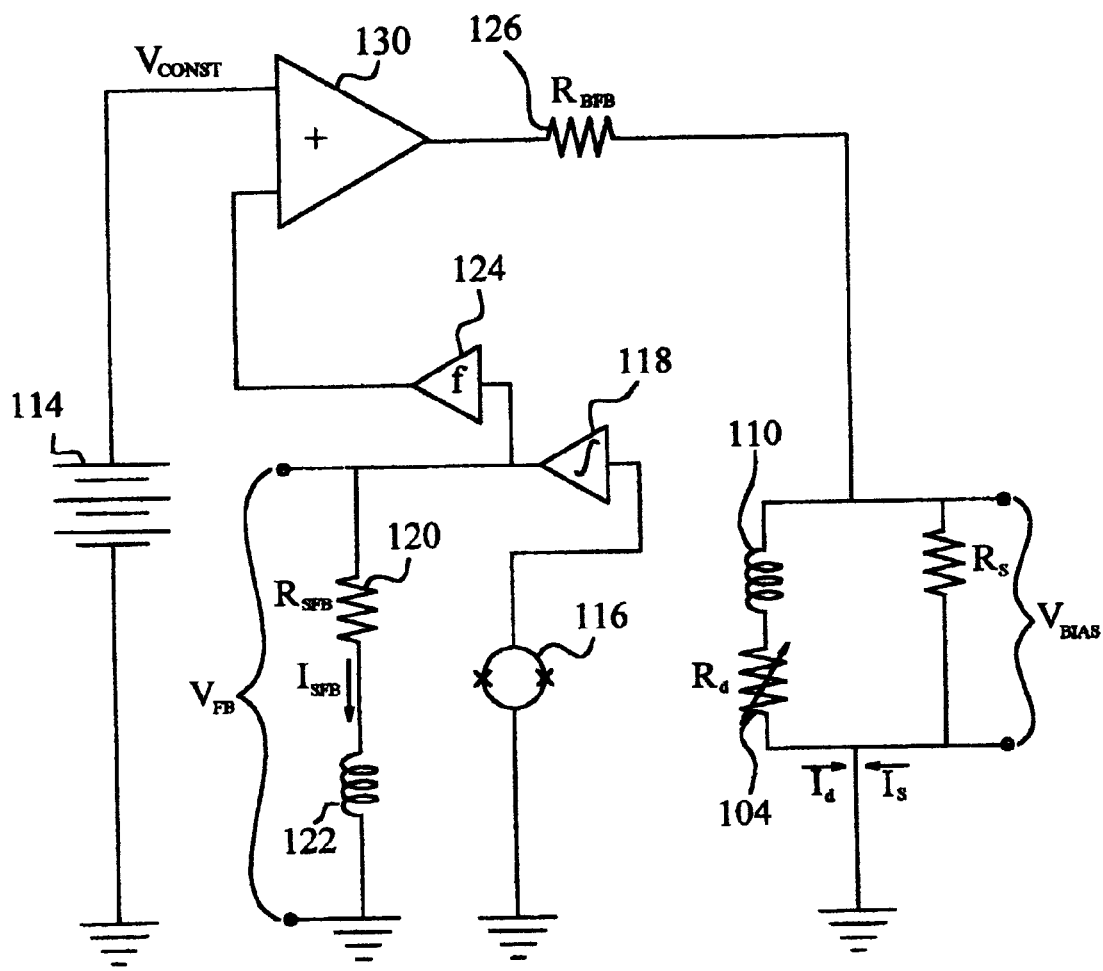
FIG. 6 is a schematic diagram showing an alternative embodiment of the TES of FIG. 4.

Negative voltage-bias feedback of the TES with enhanced ETF can be provided in a number of ways. For example, another embodiment of the TES according to the invention is illustrated in FIG. 6. In this case, a summing amplifier 130 adds the feedback voltage $V_{fb}$ and the DC voltage $V_{const}$, supplied by voltage source 114. Another function of amplifier 130 is to remove the undesirable DC offset produced by amplifiers 118 and 124.

The above configurations of the superconducting transition-edge sensor are given only as illustrations. Therefore, the scope of the invention should be determined not by the specific examples given, but by the appended claims and their equivalents.

What is claimed is:

1. A superconducting sensor for measuring an energy pulse of an elementary particle, said superconducting sensor having an operating-temperature range, a superconducting transition, and an intrinsic recovery time associated with said energy pulse, said operating-temperature range corresponding to said superconducting transition, said superconducting sensor comprising:
   electrothermal-feedback means for maintaining said operating-temperature range by utilizing a voltage bias that produces a variable electrical current through said electrothermal-feedback means;
   a heat sink thermally coupled to said electrothermal-feedback means and held at a temperature below said operating-temperature range;
   bias-feedback means, electrically coupled with said electrothermal-feedback means, for providing said superconducting sensor with an enhanced recovery time associated with said energy pulse, said enhanced recovery time being substantially shorter than said intrinsic recovery time; and
   current-sensing means, electrically coupled with said bias-feedback means, for measuring changes in said variable electrical current caused by said energy pulse and for sending a signal corresponding to said changes to said bias-feedback means.

2. The superconducting sensor of claim 1 wherein said electrothermal-feedback means includes a detector element having a variable resistance that is temperature-dependent.

3. The superconducting sensor of claim 2 wherein said voltage bias is applied across said detector element.

4. The superconducting sensor of claim 3 wherein said enhanced recovery time is achieved by reducing said voltage bias during said energy pulse with said bias-feedback means.

5. The superconducting sensor of claim 1 wherein said current-sensing means comprises a SQUID, inductively coupled with said electrothermal-feedback means.

6. A superconducting sensor for measuring an energy pulse of an elementary particle, said superconducting sensor comprising:
   an electrothermal-feedback circuit;
   a heat sink thermally coupled to said electrothermal-feedback circuit;
   a bias-feedback circuit, electrically coupled with said electrothermal-feedback circuit; and
   a current sensor electrically coupled with said bias-feedback circuit.

7. The superconducting sensor of claim 6 wherein said electrothermal-feedback circuit includes a detector element having an operating-temperature range and a superconducting transition, said operating-temperature range corresponding to said superconducting transition.

8. The superconducting sensor of claim 7 wherein said heat sink is maintained at a temperature below said operating-temperature range.

9. The superconducting sensor of claim 7 wherein said detector element has a variable resistance that is temperature dependent, said detector element being maintained within said operating-temperature range by a voltage bias applied across said detector element to provide a Joule heating thereto, said Joule heating being equal to the square of said voltage bias divided by said variable resistance.

10. The superconducting sensor of claim 9 wherein a temperature gain and a corresponding resistance increase of said detector element caused by said energy pulse produces a reduction in said Joule heating.

11. The superconducting sensor of claim 10 wherein said reduction in Joule heating is augmented by a reduction in said voltage bias produced during said energy pulse by said bias-feedback circuit.

12. The superconducting sensor of claim 11 wherein said reduction in said voltage bias is produced in response to a signal from said current sensor to said bias-feedback circuit, said signal corresponding to said energy pulse.

13. The superconducting sensor of claim 12 wherein said detector element has an intrinsic recovery time associated with said energy pulse and wherein said reduction in Joule heating augmented by said reduction in voltage bias provides said detector element with an enhanced recovery time associated with said energy pulse, said enhanced recovery time being substantially shorter than said intrinsic recovery time.

14. The superconducting sensor of claim 6 wherein said bias-feedback circuit includes a variable-gain amplifier coupled in series with a resistor element.

15. The superconducting sensor of claim 6 wherein said current sensor comprises a SQUID array, inductively coupled with said electrothermal-feedback circuit.

16. A superconducting sensor for measuring an energy pulse of an elementary particle, said sensor comprising:
   a detector element having an operating-temperature range and a superconducting transition, said operating-temperature range corresponding to said superconducting transition, said detector element having a variable resistance that is temperature-dependent and an intrinsic recovery time associated with said energy pulse;
   a heat sink thermally coupled to said detector element and held at a temperature below said operating-temperature range;
   biasing means, electrically coupled with said detector element, for maintaining said detector element within said operating-temperature range by applying a voltage bias across said detector element, said voltage bias resulting in a variable current through said detector element;
   bias-feedback means electrically coupled with said biasing means for reducing said voltage bias during said energy pulse to provide said detector element with an enhanced recovery time associated with said energy pulse, said enhanced recovery time being substantially shorter than said intrinsic recovery time; and
   current-sensing means, electrically coupled with said bias-feedback means and inductively coupled with said biasing means, for measuring changes in said variable current caused by said energy pulse and for sending a signal corresponding to said changes to said bias-feedback means.

17. The superconducting sensor of claim 16 wherein said detector element has a positive temperature coefficient of electrical resistance in said superconducting transition.

18. The superconducting sensor of claim 16 wherein said enhanced recovery time is achieved through a reduction in Joule heating of said detector element in response to a temperature gain of said detector element caused by said energy pulse, the reduction in Joule heating being augmented by a reduction in said voltage bias during said energy pulse, the reduction in said voltage bias being produced by said bias-feedback means in response to a signal from said current-sensing means, said signal corresponding to said energy pulse.

19. The superconducting sensor of claim 16 wherein said bias-feedback means comprises a variable-gain amplifier coupled to a summing amplifier.

20. The superconducting sensor of claim 16 wherein the energy deposited into said detector element by said elementary particle is calculated by integrating the change in said variable current value over said enhanced recovery time and multiplying a result by said voltage bias.

21. A method for measuring an energy of a pulse produced by an elementary particle, said method comprising the steps of:

providing a detector element having an operating-temperature range and a superconducting transition, said operating-temperature range corresponding to said superconducting transition, said detector element having a variable resistance that is temperature dependent;

thermally coupling said detector element to a heat sink, said heat sink being held at a temperature below said operating-temperature region;

maintaining said detector element in said operating-temperature region by voltage-biasing said detector element to produce a variable current therethrough and by reducing the voltage bias during said energy pulse according to a feedback signal to provide said detector element with an abbreviated recovery time associated with said pulse; and measuring change in said variable current during said abbreviated recovery time, said feedback signal being based on these measurements.

* * * * *

UNITED STATES PATENT AND TRADEMARK OFFICE
CERTIFICATE OF CORRECTION

PATENT NO.    : 6,211,519 B1
DATED         : April 3, 2001
INVENTOR(S)   : Nam, Sae Woo et al.

It is certified that error appears in the above-identified patent and that said Letters Patent is hereby corrected as shown below:

<u>Column 1,</u>
Line 9, please replace "DE-FG03-90ER4056" with -- DE-FG03-90ER40569 --.

Signed and Sealed this

Twenty-sixth Day of November, 2002

Attest:

Attesting Officer

JAMES E. ROGAN
*Director of the United States Patent and Trademark Office*